United States Patent
Lee (10) Patent No.: US 8,050,372 B2
(45) Date of Patent: Nov. 1, 2011

(54) CLOCK-DATA RECOVERY CIRCUIT, MULTI-PORT RECEIVER INCLUDING THE SAME AND ASSOCIATED METHODS

(75) Inventor: Kyong-Su Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 759 days.

(21) Appl. No.: 12/153,212

(22) Filed: May 15, 2008

(65) Prior Publication Data

US 2008/0285694 A1    Nov. 20, 2008

(30) Foreign Application Priority Data

May 16, 2007    (KR) .................. 10-2007-0047748

(51) Int. Cl.
*H04L 7/00*    (2006.01)
(52) U.S. Cl. ........ 375/355; 375/371; 375/373; 375/374; 375/375; 375/376; 713/500; 713/503; 713/600; 370/503

(58) Field of Classification Search ............... 375/355, 375/371, 373–376; 713/500, 503, 600; 370/503
See application file for complete search history.

(56) References Cited

U.S. PATENT DOCUMENTS

| | | | | |
|---|---|---|---|---|
| 5,703,905 | A | * 12/1997 | Langberg | ..................... 375/232 |
| 7,127,022 | B1 | 10/2006 | Dieguez | |
| 2006/0031701 | A1 | 2/2006 | Nam et al. | |

FOREIGN PATENT DOCUMENTS

KR    10-2006-0013206 A    2/2006
KR    10-2006-0106552 A    10/2006

\* cited by examiner

*Primary Examiner* — Phuong Phu
(74) *Attorney, Agent, or Firm* — Lee & Morse, P.C.

(57) ABSTRACT

A clock-data recovery circuit includes a plurality of input ports and a code generation circuit. The plurality of input ports generates sampling clock signals based on digital control codes and samples input data signals based on the sampling clock signals to generate output data signals and phase detection signals, respectively. The code generation circuit generates the digital control codes based on the phase detection signals received from the input ports during a training mode.

18 Claims, 4 Drawing Sheets

IF DATA(CLK0)≠DATA(XCLK0)=DATA(CLK1)

IF DATA(CLK0)=DATA(XCLK0)≠DATA(CLK1)

CLOCK-DATA RECOVERY CIRCUIT, MULTI-PORT RECEIVER INCLUDING THE SAME AND ASSOCIATED METHODS

BACKGROUND OF THE INVENTION

1. Field of the Invention

Embodiments relate to transmission/reception of data. More particularly, embodiments relate to a clock-data recovery circuit, a multi-port receiver including the clock-data recovery circuit, and a method of recovering clocks and data.

2. Description of the Related Art

As a chip-to-chip data rate expands to a radio frequency (RF) band, a system may be seriously affected by skew between input pins. Skew may be caused by a routing path, a parasitic element, noise, and so forth. To compensate for skew of each input pin, clock information from data stream at a reception end may be extracted. Thus, a clock-data recovery (CDR) circuit has been adopted in an inter-chip transceiver.

A typical CDR circuit includes a sampler, a voltage-controlled oscillator, a phase-frequency detector, and a charge pump/loop filter. When operated as a binary-type CDR circuit, the CDR circuit repeatedly receives a data signal to detect data transition points.

In a typical multi-port receiver, CDR circuits are provided for each input pin of the multi-port receiver. The CDR circuits independently recover each of clocks based on the input data signals and generate output data signals in accordance with a multi-phase clock signal, based on a reference clock signal.

Accordingly, the multi-port receiver has to activate CDR circuits and receive signals having minimum data transition point from the transmitter to maintain skew information of each input pin even in a standby mode. If the multi-port receiver deactivates the CDR circuits and data is not transferred to the receiver in the standby mode, a phase locking time of the CDR circuit is increased when the multi-port receiver is woken up from the standby mode to an active mode, thereby increasing a latency of the transmitter/receiver system.

When a same reference clock signal is shared between a receiver and a transmitter, e.g., in a chip-to-chip data transmission/reception, the CDR circuit may be practically limited to phase alignment or deskewing. As such, when phase alignment or deskewing alone is required, implementation of an independently driven CDR unit for each input pin may not be practical. Further, a capacitor included in a loop filter of each CDR unit generally occupies a large area, thus using individual CDR units for each pin may be unsuitable to portable systems.

SUMMARY OF THE INVENTION

Embodiments are therefore directed to a clock-data recovery circuit, a multi-port receiver including the clock-data recovery circuit, and a method of recovering clocks and data, which substantially overcome one or more of the limitations and disadvantages of the related art.

It is therefore a feature of an embodiment to provide a clock-data recovery (CDR) circuit reducing a mount area of a system by sharing a structure for a CDR, a multi-port receiver including the CDR circuit, and a method of recovering clock-data.

It is therefore another feature of an embodiment to provide a CDR circuit reducing a wake-up latency using stored skew information during a transition stage from a standby mode to an active mode, a multi-port receiver including the CDR circuit, and a method of recovering clock-data.

It is therefore another feature of an embodiment to provide a CDR circuit reducing power consumption, a multi-port receiver including the CDR circuit, and a method of recovering clock-data.

In some example embodiments of the present invention, a CDR circuit includes a plurality of input ports and a code generation circuit.

The plurality of input ports generates sampling clock signals based on digital control codes and samples input data signals based on the sampling clock signals to generate output data signals and phase detection signals. The code generation circuit generates the digital control codes based on the phase detection signals received from the input ports during a training mode.

The code generation circuit may include a charge pump, a loop filter, and an analog-digital converter that are shared by the plurality of input ports. The code generation circuit may sequentially generate the digital control codes using the shared charge pump, the shared loop filter, and the shared analog-digital converter. The code generation circuit may further include a storage device storing the sequentially generated digital control codes. The code generation circuit may further respectively output the digital control codes stored in the storage device to the corresponding input ports.

A power supply voltage may be provided to the storage device during a standby mode in order to maintain the stored digital control codes. The shared charge pump, the shared loop filter, and the shared analog-digital converter may be deactivated during the standby mode. The code generation circuit may further renew the digital control code stored in the storage device by periodically performing the training mode during an active mode.

The code generation circuit may include a multiplexer, a charge pump and loop filter, an analog-digital converter, and a demultiplexer. The multiplexer may select and output the phase detection signals in response to a port selection signal. The charge pump and loop filter may generate control voltages in response to an output signal of the multiplexer. The analog-digital converter may digitize the control voltages and output digital control codes. The demultiplexer may receive the digital control codes from the analog-digital converter and select a plurality of output lines in response to the port selection signal to output each of the digital control codes through the selected output line.

The code generation circuit may further include a storage device. The storage device may store the digital control codes output from the demultiplexer in response to the port selection signal and may further output each of the stored digital control codes to the corresponding input port.

Each of the input ports may include a local phase aligner and a sampler. The local phase aligner may generate a corresponding sampling clock signal compensated for a skew in response to a multi-phase clock signal and a corresponding digital control code. The sampler may sample a corresponding input data signal in response to each of the sampling clock signal to generate the output data signal.

Each of the input ports may further include a phase detector generating a corresponding phase detection signal based on a phase of the output data signal and the sampling clock signals. The phase detector may be activated only during the training mode.

For example, the local phase aligner may include a digital-analog converter, a voltage-controlled delay line, and an interpolator. The digital-analog converter may convert each of the digital control signals to an analog signal. The voltage-controlled delay line may control a phase of the multi-phase clock signal in response to the analog signal to generate a first sampling clock signal. The interpolator may interpolate the first sampling clock signal to generate a second sampling clock signal for oversampling the input data signal and output the first sampling clock signal and the second sampling clock signal to the sampler.

For example, the local phase aligner may include a digital-controlled oscillator and an interpolator. The digital-controlled oscillator may control a phase of the multi-phase clock signal in response to a corresponding digital control signal to generate a first sampling clock signal. The interpolator may interpolate the first sampling clock signal to generate a second sampling clock signal, and may output the first sampling clock signal and the second sampling clock signal to the sampler.

In some example embodiments of the present invention, a multi-port receiver includes a plurality of input pins, a plurality of input ports, a code generation circuit, and a control circuit.

The multi-port receiver may receive input data signals through the plurality of input pins. The plurality of input ports may generate each of sampling clock signals based on each of digital control codes, and may sample each of the received input data signals to generate output data signals and phase detection signals based on the sampling clock signals. The code generation circuit may generate the digital control codes based on phase detection signals received from the input ports during a training mode. The control circuit may generate a control signal for controlling the code generation circuit in response to a mode signal.

In some embodiments, the multi-port receiver may further include a phase locked loop. The phase locked loop may generate a multi-phase clock signal based on a reference clock signal in common with a transmitter and may provide the multi-phase clock signal to the plurality of input ports.

In some embodiments, the multi-port receiver may further include a clock recovery circuit. The clock recovery circuit may recover a reference clock signal based on one of the input data signals, generate a multi-phase clock signal based on the recovered reference clock signal, and provide the multi-phase clock signal to the plurality of input ports.

The code generation circuit may include a charge pump, a loop filter, and an analog-digital converter. The charge pump, the loop filter, and the analog-digital converter may be shared by the input ports. The code generation circuit may generate the digital control codes using the shared charge pump, the shared loop filter, and the shared analog-digital converter. The code generation circuit may further include a storage device for the generated digital control codes. The code generation circuit may further respectively output the digital control codes stored in the storage device to the corresponding input ports.

A power supply voltage may be provided to the storage device during a standby mode in order to maintain the stored digital control codes. The shared charge pump, the shared loop filter, and the shared analog-digital converter may be deactivated during the standby mode.

Each of the input ports may include a phase detector generating a corresponding phase detection signal based on a phase of a corresponding output data signals and a corresponding sampling clock signals. The phase detector may only be activated during the training mode.

In a method of recovering clock-data according to some example embodiments of the present invention, sampling clock signals are generated based on digital control codes, respectively. Output data signals are generated by sampling input data signals based on the sampling clock signals. Phase detection signals are generated based on each of the output data signals and the sampling clock signals. The digital control codes are generated based on the phase detection signals during a training mode.

In generating the digital control codes, the digital codes may be sequentially generated by using a shared charge pump, a shared loop filter, and a shared analog-digital converter. The sequentially generated digital control codes may be stored, and the stored digital control codes may be output to the input ports.

In a method of recovering clock-data according to some example embodiments of the present invention, the digital control codes stored in the storage device may be renewed by periodically being performed the training mode during an active mode.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Korean Patent Application No. 2007-0047748, filed on May 16, 2007, in the Korean Intellectual Property Office, and entitled: "Clock-Data Recovery Circuit, and Multi-Port Receiver Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
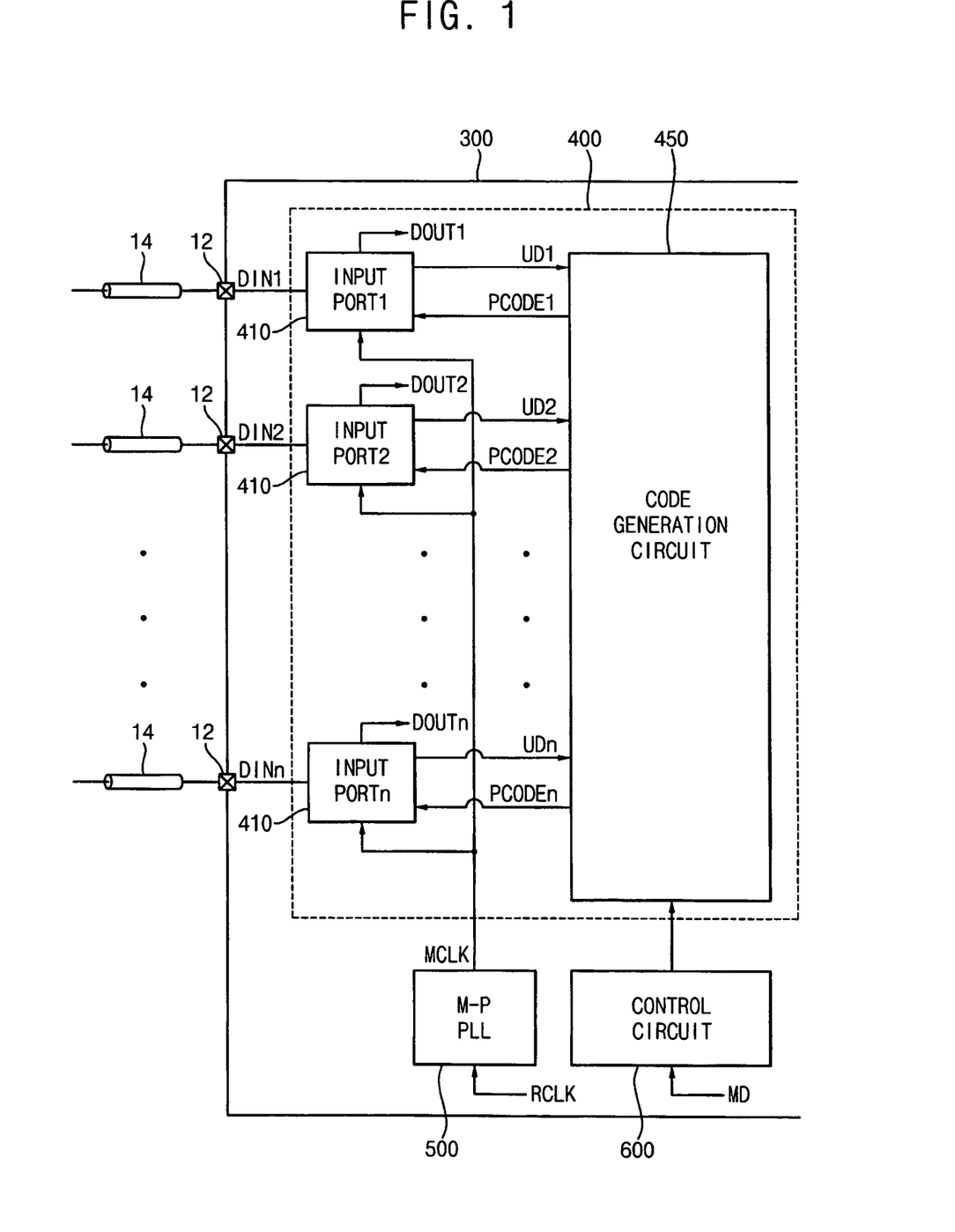
FIG. 1 illustrates a block diagram of a multi-port receiver including a clock-data recovery circuit according to an example embodiment of the present invention.

FIG. 1 illustrates a block diagram of a multi-port receiver including a clock-data recovery (CDR) circuit according to an example embodiment of the present invention.

Referring to FIG. 1, a multi-port receiver 300 may include a plurality of input pins 12, a CDR circuit 400, and a control circuit 600. The multi-port receiver 300 may receive first to nth input data signals DIN1, DIN2, and DINn of channels 14 through a plurality of input pins 12.

The CDR circuit 400 may include a plurality of input ports 410 and a code generation circuit 450. The input ports 410 may correspond to each pin in the plurality of pins 12 and may internally generate each sampling clock signal based on respective first to nth digital control codes PCODE1, PCODE2, and PCODEn. The input ports 410 may sample first to nth input data signals DIN1, DIN2, and DINn based on the internally generated sampling clock signals to generate respective first to nth output data signal DOUT1, DOUT2, and DOUTn, and first to nth phase detection signals UD1, UD2, and UDn, respectively. The input data signals DIN1, DIN2, and DINn may be received as a serial data stream. The sampled output data signals DOUT1, DOUT2, and DOUTn may be transmitted to an internal circuit (not shown) of the multi-port receiver 300 and then the original data are recovered.

After the multi-port receiver 300 is powered up, the digital control codes PCODE1, PCODE2, and PCODEn, e.g., including phase or skew information of each pin, may be generated during a training mode. The code generation circuit 450 may generate the digital control codes PCODE1, PCODE2, and PCODEn based on the phase detection signals UD1, UD2, and UDn received from the input ports 410 in the training mode.

The control circuit 600 may generate a control signal for controlling the code generation circuit 450 in response to a mode signal MD. The mode signal MD may include a signal indicating the training mode. The mode signal MD may further include a standby mode signal indicating a power-down mode for reducing power consumption while data signals are not input. The control circuit 600 may control the training operation by generating a port selection signal PTSEL and/or an enable signal EN in response to the mode signal MD.

The multi-port receiver 300 may further include a multi-phase phase locked loop (MP-PLL) 500 that generates a multi-phase clock signal MCLK provided to the plurality of input ports 410. For example, the MP-PLL 500 may generate the multi-phase clock signal MCLK based on a reference clock signal RCLK. In case of a short-distance data transmission/reception, e.g., when a transmitter and a receiver are integrated in a same substrate, the reference clock signal RCLK may be identical to a clock signal used for transmitting data in the transmitter. When the transmitter and the receiver use the same clock signal, the plurality of input ports 410 included in the multi-port receiver 300 may substantially function as a phase aligner or a deskewer, and a frequency of the clock signal for data sampling is determined by the reference clock signal.

When the transmitter and the receiver are relatively far apart, such that the same reference clock signal may not be used commonly for the transmitter and the receiver, the multi-port receiver 300 may include a clock recovery circuit in place of the MP-PLL 500 in FIG. 1. The clock recovery circuit may recover the reference clock signal based on one of the input data signals DIN1, DIN2, and DINn, and generate the multi-phase clock signal MCLK based on the recovered reference clock signal.

The training operation may be performed after the multi-port receiver 300 is powered up. In the training mode, the digital control codes PCODE1, PCODE2, and PCODEn, including phase or skew information of each pin, may be generated. The code generation circuit 450 may generate the digital control codes PCODE1, PCODE2, and PCODEn based on the phase detection signals UD1, UD2, and UDn received from the input ports 410 during the training mode.

Figure 2:
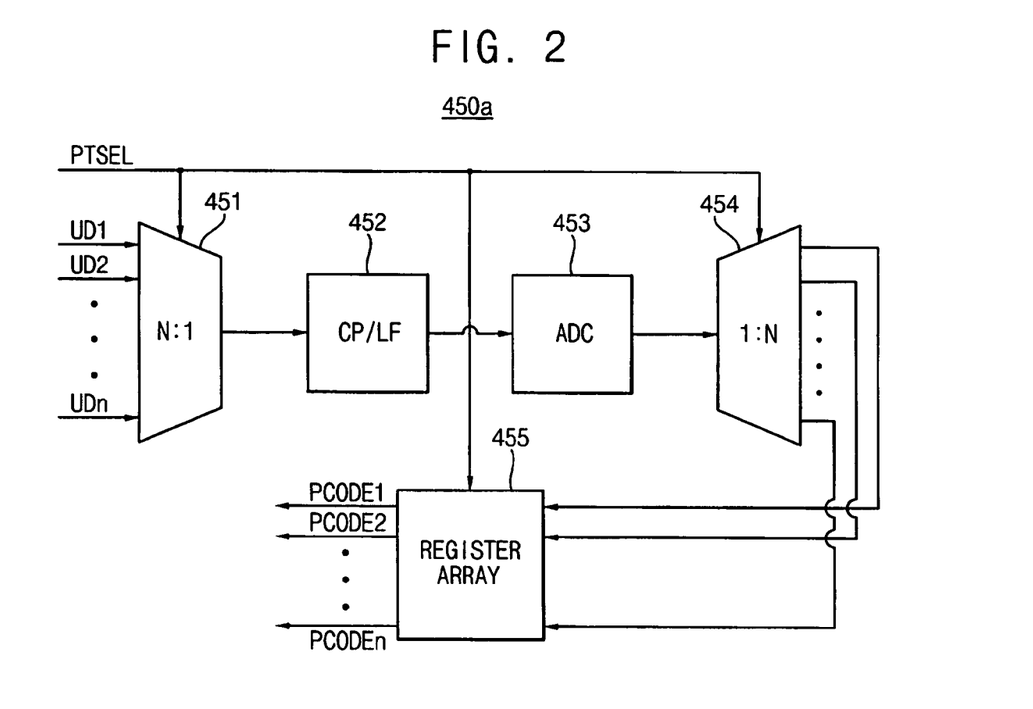
FIG. 2 illustrates a block diagram of a code generation circuit included in the clock-data recovery circuit in FIG. 2.

FIG. 2 illustrates a block diagram of a code generation circuit 450a in accordance with a first embodiment for use as the code generation circuit 450 in the CDR circuit 400 in FIG. 1. The code generation circuit 450a may include a multiplexer 451, a charge pump/loop filter (CP/LF) 452, an analog-digital converter (ADC) 453, and a demultiplexer 454.

The CP/LF 452 and the ADC 453 may be shared by the input ports 410 in FIG. 1. The port selection signal PTSEL may control multiplexing and demultiplexing. The code generation circuit 450a may sequentially generate the digital control codes PCODE1, PCODE2, and PCODEn. The code generation circuit 450a may include a storage device for storing the sequentially generated digital control codes PCODE1, PCODE2, and PCODEn, and the stored digital control codes PCODE1, PCODE2, and PCODEn may be output to the input ports 410 in FIG. 1.

The multiplexer 451 may sequentially select and output the phase detection signals UD1, UD2, and UDn in response to the port selection signal PTSEL. The CP/LF 452 may generate a respective control voltage in response to the output signal of the multiplexer 451. The control voltage is a voltage that is applied to a voltage-controlled oscillator in a typical phase-locked loop. The ADC 453 may sequentially convert each of the control voltages to each of the digital control codes PCODE1, PCODE2, and PCODEn. The demultiplexer 454 may sequentially select a plurality output lines in response to the port selection signal PTSEL and sequentially outputs each of the sequentially input digital control codes PCODE1, PCODE2, and PCODEn.

The code generation circuit 450a may include a storage device for storing the digital control codes PCODE1, PCODE2, and PCODEn. For example, the storage device may be implemented by a register array 455 including flip-flops. The register array 455 may store the digital control codes PCODE1, PCODE2, and PCODEn sequentially output through each of output lines of the demultiplexer 454. The register array 455 may store the digital control codes PCODE1, PCODE2, and PCODEn in a predetermined location of the register array 455 in response to the port selection signal PTSEL. Each of the stored digital control codes PCODE1, PCODE2, and PCODEn may be output to the corresponding input ports 410 in FIG. 1, respectively.

In an initializing process that occurs after the multi-port receiver 300 is powered up, the training operation may be performed for generating the digital control codes PCODE1, PCODE2, and PCODEn including phase or skew information of each pin. The code generation circuit 450a may be activated to generate the digital control codes PCODE1, PCODE2, and PCODEn including skew information of each input pin 410 during the training mode.

In an implementation, when the transmitter/receiver system operates for a relatively long time, skew information of each pin may be changed according to a variation of data input-output (I/O) environment. To reflect the change of skew information, the code generation circuit 450a may renew the digital control codes PCODE1, PCODE2, and PCODEn stored in the storage device by periodically performing the training operation, rather than only after the multi-port receiver 300 is powered up.

During the standby mode, the code generation circuit 450a may reduce power consumption by deactivating the shared CP/LF 452 and the ADC 453. The power supply voltage may be provided to the storage device in order to maintain the stored digital control codes PCODE1, PCODE2, and PCODEn. When the register array 455 is implemented by flip-flops, the power supply voltage is applied to the register array 455 for maintaining the stored data during the standby mode. Since a static current is not required for maintaining the stored data when flip-flops are used, power consumption of the register array 455 may be negligible.

As mentioned above, phase information or skew information digitized by the digital control codes may be preserved by providing power only to the storage device when entering the power-down mode or the standby mode. When the multi-port receiver wakes up, i.e., enters the active mode, stored digital control codes PCODE1, PCODE2, and PCODEn may be transmitted to each of the input ports 410 and converted to analog information through a digital-analog converter therein, as discussed below, so that a voltage-controlled delay line therein may be driven when the receiver wakes up into the active mode. Accordingly, an initial phase of the CDR circuit when waking up from the standby mode may be approximately the same as during the active mode. Thus, a locking time of the CDR circuit, i.e., a wake-up latency, may be reduced.

Figure 3:
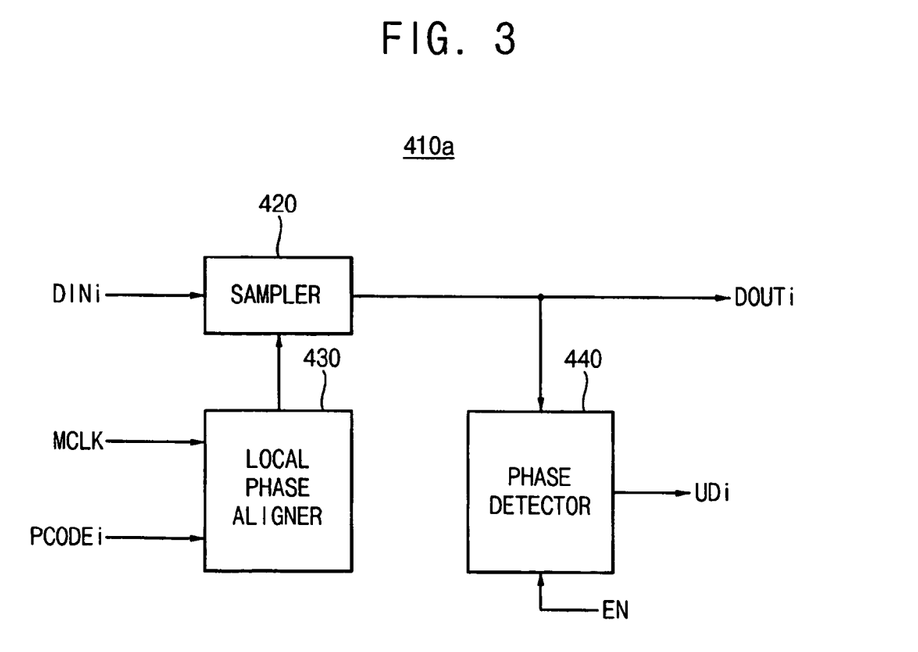
FIG. 3 illustrates a block diagram of an input port included in the clock-data recovery circuit in FIG. 1 according to an example embodiment.

FIG. 3 illustrates an example embodiment of an input port 410a to be used as the input port 410 in the CDR circuit 400 in FIG. 1. Referring to FIG. 3, each input port 410a may include a sampler 420 and a local phase aligner 430. Each input port 410a may further include a phase detector 440.

The local phase aligner 430 may generate a corresponding sampling clock signal compensated for a skew in response to a multi-phase clock signal MCLK and the corresponding digital control code PCODEi, where i is from 1 to n. The sampler 420 may sample the corresponding input data signal DINi to generate the output data signal DOUTi in response to the sampling clock signal provided from the local phase aligner 430.

The phase detector 440 may generate the phase detection signal UDi based on phases of the output data signal DOUTi and the sampling clock signal. Because the local phase aligner 430 generates the sampling clock signal compensated for the skew of each pin based on the digital control code PCODEi stored in the code generation circuit 450a of FIG. 2, the phase detector 440 may be activated only during the training mode, and may otherwise be deactivated, thereby reducing power consumption. As mentioned above, the training mode is performed after the receiver is powered up to generate the digital control code PCODEi and/or the training mode may be periodically performed for renewing the digital control code PCODEi. The local phase aligner 430 may be activated in response to an enable signal EN received from the control circuit 600.

Figure 4:
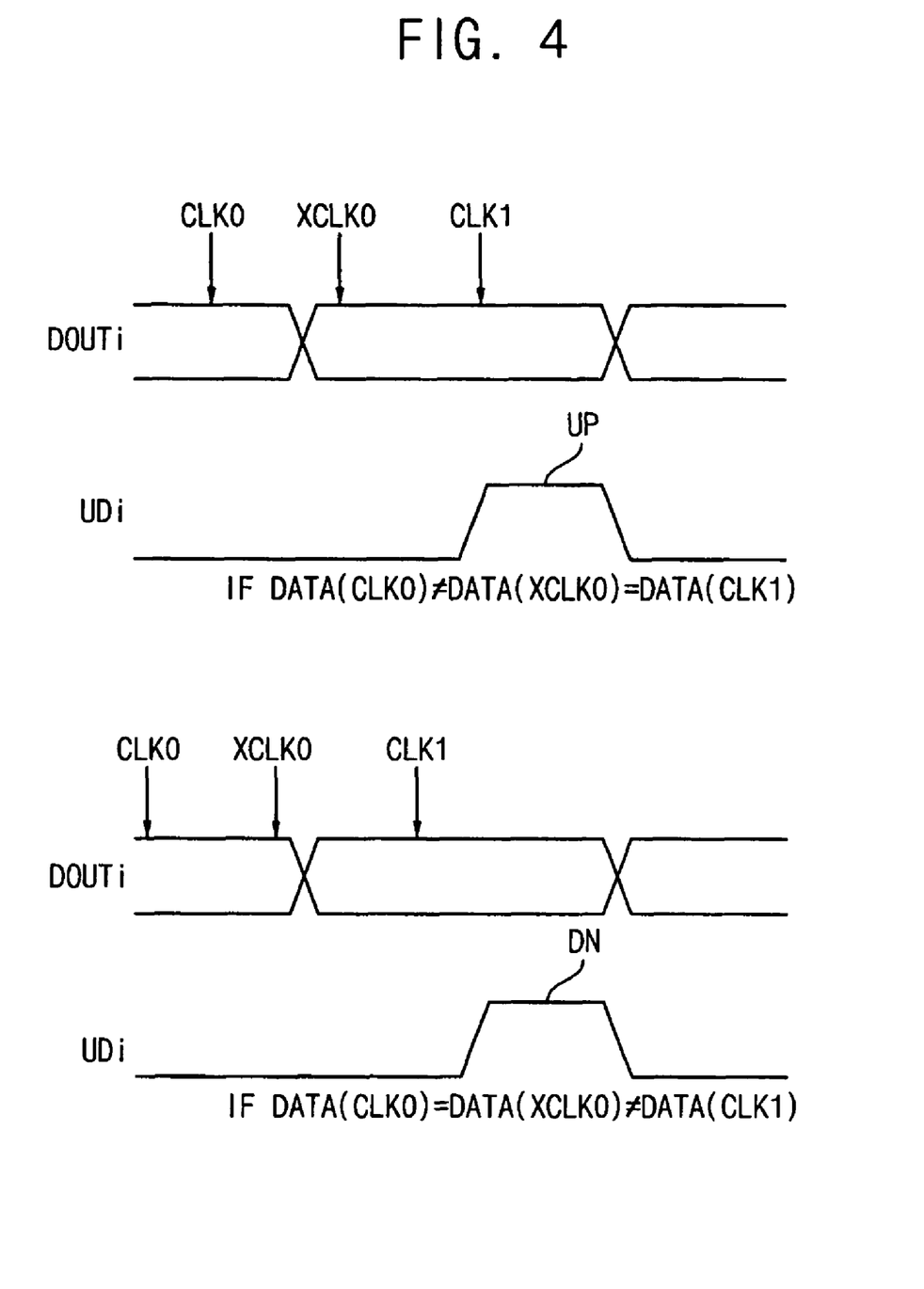
FIG. 4 illustrates a diagram for describing an example operation of the phase detector included in the input port of FIG. 3.

FIG. 4 illustrates an example operation of the phase detector 440 included in the input port 410a of FIG. 3.

An example of the phase detection signal for controlling the phase of the sampling clock signal by oversampling, e.g., using an up signal UP and a down signal DN, is illustrated in FIG. 4. The sampler 420 may receive the input data signal DINi, oversample the received input data signal DINi, and output the output data signal DOUTi. The local phase aligner 430 may include an interpolator for generating 2× sampling clock signals for oversampling.

The phase detector 440 may be implemented by logic elements, e.g., an exclusive OR (XOR) gate. The phase detector 440 may determine whether the phase of the sampling clock signal lags or leads relative to a center of each data bit based on three sequential data, which are oversampled from the output data signal DOUTi. The phase detector 440 may generate the up signal UP and the down signal DN based on the result.

When a first data DATA(CLK0) of the three sequential data is different from a second data DATA(XCLK0) and a third data DATA(CLK1) is identical to the second data DATA(XCLK0), the phase detector 440 may generate the up signal UP. In contrast, when the first data DATA(CLK0) is identical to the second data DATA(XCLK0), and the second data DATA(XCLK0) is different from the third data DATA(CLK1), the phase detector 440 may generate the down signal DN.

The up signal UP and the down signal DN generated by the phase detector 440 of each input port 410a may be sequentially provided to the code generation circuit 450a as the phase detection signal UDi. As described with reference to FIG. 2, the charge pump of the CP/LF 452 may generate a current for charging or discharging the loop filter based on the phase detection signal UDi that is sequentially selected by the multiplexer 451.

The charge current or the discharge current may determine an analog control voltage. Each of the analog control voltages may be converted to the digital control code PCODEi by the ADC 453 and stored in the register array 455. The stored digital control code PCODEi may be provided to the local phase aligner 430 of each input port 410a and may be used for controlling the phase of the sampling clock signal. By repeating the feedback loop as mentioned above, the initial phase of the multi-phase clock signal MCLK may be adjusted. Thus, the digital control code PCODEi may be adjusted such that a transition point of the sampling clock signal may be aligned to a center of the input data.

Figure 5:
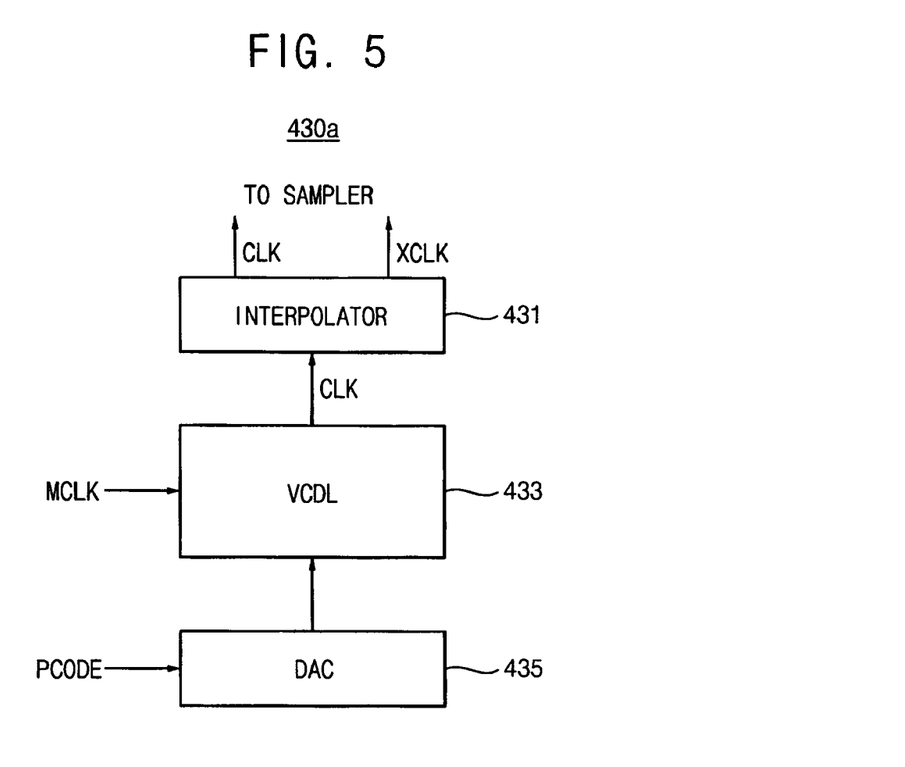
FIG. 5 illustrates a block diagram of an example embodiment of a local phase aligner included in the input port of FIG. 3.

FIG. 5 illustrates an example embodiment of a local phase aligner 430a for used as the local phase aligner 430 included in the input port 410a of FIG. 3. Referring to FIG. 5, the local phase aligner 430a may include an interpolator 431, a voltage-controlled delay line (VCDL) 433, and a digital-analog converter (DAC) 435.

The DAC 435 may convert the digital control signal PCODE to the analog signal. For example, the analog signal may be a recovered signal corresponding to the control voltage generated by the CP/LF 452 in the code generation circuit 450a of FIG. 2. The VCDL 433 may control the phase of the multi-phase clock signal MCLK to generate a first sampling clock signal CLK in response to the analog signal. The interpolator 431 may interpolate the first sampling clock signal CLK to generate a second sampling clock signal XCLK, and may output the first sampling clock signal CLK and the second sampling clock signal XCLK to the sampler 420.

Figure 6:
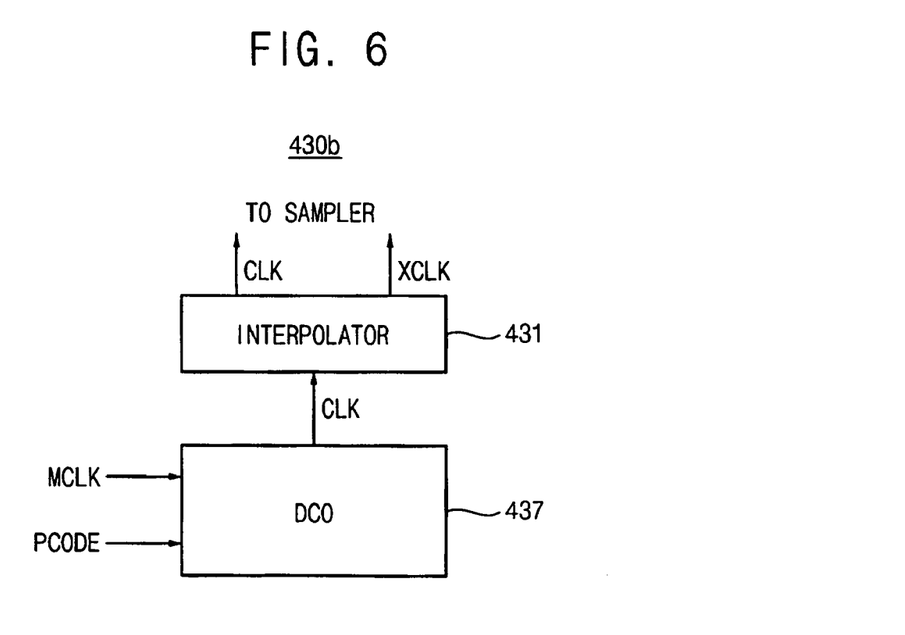
FIG. 6 illustrates a block diagram of another example embodiment of a local phase aligner included in the input port of FIG. 3.

FIG. 6 illustrates another example of a local phase aligner 430b to be used as the local phase aligner 430 included in the input port 410a of FIG. 3. Referring to FIG. 6, the local phase aligner 430b may include the interpolator 431 and a digital-controlled oscillator (DCO) 437. Compared with the local phase aligner 430a of FIG. 5, the local phase aligner 430b of FIG. 6 replaces the VCDL 433 and the DAC 435 with the DCO 437. The DCO 437 may perform a function similar to the VCDL 433 and the DAC 435.

The DCO 437 may control the phase of the multi-phase clock signal MCLK in response to the digital control signal PCODE to generate the first sampling clock signal CLK. The interpolator 431 may interpolate the first sampling clock signal CLK to generate the second sampling clock signal XCLK for oversampling, and may output the first sampling clock signal CLK and the second sampling clock signal XCLK to the sampler 420 in FIG. 3. As such, the DAC 435 and the VCDL 433 in FIG. 5 may be replaced by the DCO 437 in FIG. 6. Thus, converting the digital control signal PCODE to the analog signal may be omitted.

Although examples of the local phase aligner for oversampling are illustrated in FIGS. 5 and 6, the second sampling clock signal XCLK for oversampling may not be required according to methods of detecting the phase of the sampling clock signal. In this case, the interpolator 431 may be omitted. The multi-phase clock signal MCLK may be substituted by a single-phase clock signal. In this case, the interpolator 321 included in each local phase aligner may generate the multi-phase clock signal that is suitable for oversampling.

As mentioned above, the CDR circuit according to example embodiments of the present invention may digitize analog phase information of each input pin. The digitized phase information may be used to compensate for skew of respective input pins, e.g., input pins used in an interface having high operation speed. Use of such digitized phase information may reduce a locking time of the CDR circuit when the CDR circuit is woken up from the standby mode to the active mode.

The digitized phase information corresponding to each pin may be used as initial phase information during a wake-up operation. The stored digital control code may be transmitted to each input port and converted to analog information to drive the voltage-controlled delay line. Therefore, an initial phase of the CDR circuit may be provided that is near the actual value, thereby reducing the locking time of the CDR circuit.

Since the charge pump/loop filter equipped in each pin of the conventional CDR circuit may be shared, design cost may be reduced and performance of the system may be enhanced.

The digitized phase information or skew information may be preserved by exclusively applying the power supply voltage to the storage device during the power-down mode or the standby mode. Therefore, the data transmission for providing skew information between the transmitter and the receiver may be omitted. Thus, power consumption may be reduced.

As mentioned above, the CDR circuit, the multi-port receiver including the CDR circuit, and the method of recovering clock-data according to example embodiments of the present invention may reduce the mount area by sharing the charge pump, loop filter and analog-digital converter.

In addition, the CDR circuit, the multi-port receiver including the CDR circuit, and the method of recovering clock-data according to example embodiments of the present invention may reduce a wake-up latency for phase locking during the wake-up operation from the standby mode to the active mode since skew information of each pin are stored and the stored skew information is used during the wake-up operation.

Moreover, since the clock recovery is not needed during the standby mode in the CDR circuit, the multi-port receiver including the CDR circuit, and the method of recovering clock-data according to example embodiments of the present invention, power consumption may be reduced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A clock-data recovery circuit, comprising:
a plurality of input ports configured to generate sampling clock signals based on digital control codes, and configured to sample input data signals based on the sampling clock signals to generate output data signals and phase detection signals; and
a code generation circuit configured to generate the digital control codes based on the phase detection signals received from the input ports during a training mode, wherein the code generation circuit includes a charge pump, a loop filter, and an analog-digital converter that are shared by the plurality of input ports, and the code generation circuit is configured to sequentially generate the digital control codes using the shared charge pump, the shared loop filter, and the shared analog-digital converter.

2. The clock-data recovery circuit as claimed in claim 1, wherein the code generation circuit further comprises a storage device configured to store the sequentially generated digital control codes, and the code generation circuit is further configured to respectively output the digital control codes stored in the storage device to the corresponding input ports.

3. The clock-data recovery circuit as claimed in claim 2, wherein a power supply voltage is provided to the storage device during a standby mode in order to maintain the stored digital control codes, and the shared charge pump, the shared loop filter, and the shared analog-digital converter are deactivated during the standby mode.

4. The clock-data recovery circuit as claimed in claim 2, wherein the code generation circuit is further configured to renew the digital control code stored in the storage device by periodically performing the training mode during an active mode.

5. The clock-data recovery circuit as claimed in claim 1, wherein the code generation circuit comprises:
a multiplexer configured to select and output the phase detection signals in response to a port selection signal, wherein
the charge pump and the loop filter are configured to generate control voltages in response to an output of the multiplexer, and
the analog-digital converter is configured to digitize each of the control voltages and output digital control codes; and a demultiplexer configured to receive the digital control codes from the analog-digital converter and configured to select one of a plurality of output lines in response to the port selection signal to output each of the digital control codes through the selected output line.

6. The clock-data recovery circuit as claimed in claim 5, wherein the code generation circuit further comprises:
a storage device configured to store the digital control codes output from the demultiplexer in response to the port selection signal and to output each of the stored digital control codes to the corresponding input port.

7. The clock-data recovery circuit as claimed in claim 1, wherein each of the input ports comprises:
a local phase aligner configured to generate a corresponding sampling clock signal compensated for a skew in response to a multi-phase clock signal and a corresponding digital control code; and
a sampler configured to sample a corresponding input data signal in response to a corresponding sampling clock signal to generate a corresponding output data signal.

8. The clock-data recovery circuit as claimed in claim 7, wherein each of the input ports further comprises:
a phase detector configured to generate a corresponding phase detection signal based on phases of the output data signal and the sampling clock signal.

9. The clock-data recovery circuit as claimed in claim 8, wherein the phase detector is exclusively activated during the training mode.

10. The clock-data recovery circuit as claimed in claim 7, wherein the local phase aligner comprises:
a digital-analog converter configured to convert a corresponding digital control signal to an analog signal;
a voltage-controlled delay line configured to control a phase of the multi-phase clock signal in response to the analog signal to generate a first sampling clock signal; and
an interpolator configured to interpolate the first sampling clock signal to generate a second sampling clock signal for oversampling the input data signal and configured to output the first sampling clock signal and the second sampling clock signal to the sampler.

11. The clock-data recovery circuit as claimed in claim 7, wherein the local phase aligner comprises:
a digital-controlled oscillator configured to control a phase of the multi-phase clock signal in response to a corresponding digital control signal to generate a first sampling clock signal; and
an interpolator configured to interpolate the first sampling clock signal to generate a second sampling clock signal and configured to output the first sampling clock signal and the second sampling clock signal to the sampler.

12. A multi-port receiver, comprising:
a plurality of input pins configured to receive input data signals;
a plurality of input ports configured to generate each of sampling clock signals based on each of digital control codes, and configured to sample each of the received input data signals to generate output data signals and phase detection signals based on the sampling clock signals;

a code generation circuit configured to generate the digital control codes based on phase detection signals received from the input ports during a training mode; and
a control circuit configured to generate a control signal for controlling the code generation circuit in response to a mode signal,
wherein the code generation circuit includes a charge pump, a loop filter, and an analog-digital converter that are shared by the input ports, and the code generation circuit is configured to sequentially generate the digital control codes using the shared charge pump, the shared loop filter, and the shared analog-digital converter.

13. The multi-port receiver as claimed in claim 12, further comprising:
a phase locked loop configured to generate a multi-phase clock signal based on a reference clock signal in common with a transmitter, and configured to provide the multi-phase clock signal to the plurality of input ports.

14. The multi-port receiver as claimed in claim 12, further comprising:
a clock recovery circuit configured to recover a reference clock signal based on one of the input data signals, generate a multi-phase clock signal based on the recovered reference clock signal, and provide the multi-phase clock signal to the plurality of input ports.

15. The multi-port receiver as claimed in claim 12, wherein the code generation circuit further comprises a storage device configured to store the generated digital control codes, and the code generation circuit is further configured to respectively output the digital control codes stored in the storage device to the corresponding input ports.

16. The multi-port receiver as claimed in claim 15, wherein a power supply voltage is provided to the storage device during a standby mode in order to maintain the stored digital control codes, and
the shared charge pump, the shared loop filter, and the shared analog-digital converter are deactivated during the standby mode.

17. The multi-port receiver as claimed in claim 12, wherein each of the input ports comprises:
a phase detector configured to generate a corresponding phase detection signal based on a phase of a corresponding output data signal and a corresponding sampling clock signal, and
wherein the phase detector is exclusively activated during the training mode.

18. A method of recovering clock-data in a clock-data recovery circuit, comprising:
generating sampling clock signals based on digital control codes;
sampling input data signals based on the sampling clock signals to generate output data signals and phase detection signals; and
sequentially generating the digital control codes based on the phase detection signals during a training mode of the clock-data recovery circuit, using a shared charge pump, a shared loop filter, and a shared analog-digital converter.

* * * * *